United States Patent [19]

Friend

BEST AVAILABLE COPY

[11] 3,919,658

[45] Nov. 11, 1975

[54] ACTIVE RC FILTER CIRCUIT

[75] Inventor: Joseph John Friend, Freehold Twp., Monmouth County, N.J.

[73] Assignee: Bell Telephone Laboratories, Incorporated, Murray Hill, N.J.

[22] Filed: May 9, 1972

[21] Appl. No.: 251,805

Related U.S. Application Data

[63] Continuation of Ser. No. 75,456, Sept. 25, 1970, abandoned.

[52] U.S. Cl. .................................. 330/69; 330/103
[51] Int. Cl.² .......................................... H03F 3/45
[58] Field of Search ...................... 330/109, 69, 155

[56] References Cited

UNITED STATES PATENTS

| | | | |
|---|---|---|---|
| 3,519,947 | 7/1970 | Thelen | 330/69 X |
| 3,530,395 | 9/1970 | Prusha | 330/69 |
| 3,566,284 | 2/1971 | Thelen | 330/69 X |
| 3,569,851 | 3/1971 | Jarmann | 330/109 |

OTHER PUBLICATIONS

Electronics Letters – Dec. 27, 1968–Vol. 4, No. 26 "High-9 Factor Circuit With Reduced Sensitivity," pp. 577–579.

Electronics Letters – Feb. 6, 1969–Vol. 5–No. 3–pp. 59, 60 – "RC Active Allpass Sections."

*Primary Examiner*—Nathan Kaufman
*Attorney, Agent, or Firm*—G. E. Murphy; W. Ryan

[57] ABSTRACT

A filter circuit is disclosed which uses an operational amplifier and a plurality of resistors and capacitors to obtain a variety of filter transfer functions. By modification of a basic circuit structure, bandpass, high-pass, low-pass notch, high-pass notch, and all-pass filter transfer functions are obtained.

10 Claims, 9 Drawing Figures

ACTIVE RC FILTER CIRCUIT

This is a continuation of application Ser. No. 75,456 filed Sept. 25, 1970 now abandoned.

BACKGROUND OF THE INVENTION

1. Field of the Invention

This invention pertains to filter circuits and, more particularly, to noninductive filter circuits using operational amplifiers.

The great deal of interest generated by the development of integrated circuits has in turn engendered considerable interest in the field of active RC, i.e., resistor-capacitor, circuits. As the name implies, an active RC circuit is one composed solely of resistors, capacitors, and some form of active element, e.g., an amplifier. Since such circuits do not use inductors, they are attractive in applications where weight and size must be minimized. Furthermore, many subsidiary problems associated with inductors are eliminated, e.g., problems arising from the magnetic fields and nonlinear behavior of inductors. In addition, RC active circuits are particularly advantageous in integrated form where, in general, the realization of inductors is not feasible.

Description of the Prior Art

Numerous circuits have been used to realize biquadratic (second-order) active filter sections. Various criteria have guided design of such circuits including miniaturization, economy, simplicity, low characteristic variability, realization in canonic form, etc. Many of such circuits, although complying with some of the mentioned criteria, are extremely complex, requiring many components and expensive active elements, or are highly sensitive to parameter changes in the various elements of which they are comprised.

It is an object of this invention to realize, economically, a second-order filter section which substantially complies with all of the above-identified criteria.

SUMMARY OF THE INVENTION

In accordance with the principles of this invention, the circuit of this invention uses operational amplifier because of the availability, quality, and low cost of such amplifiers. Furthermore, only one operational amplifier is used per second-order filter section, in conjunction with a plurality of resistors and capacitors, thereby providing suitable filter sections at minimum cost. In addition, the circuit is a canonic realization and utilizes a single topological form for a wide variety of desired biquadratic filter transfer functions. By the simple addition or deletion of resistors, bandpass, high-pass, low-pass notch and high-pass notch, and all-pass filter transfer functions may be realized.

More particularly, the basic circuit structure of this invention comprises an operational amplifier shunted by two resistors; a circuit branch including a resistor and a first capacitor connects the input of the filter to one of the inputs of the operational amplifier. A second capacitor is connected beween the interconnection of the resistor and capacitor of the circuit branch and the output of the amplifier and a resistor also connects this point of interconnection to a terminal of fixed potential. Additional resistors connect the input of the filter to the two inputs of the amplifier and the inputs of the amplifier to said terminal of fixed potential. The desired output of the filter is obtained at the amplifier output terminal.

DETAILED DESCRIPTION OF THE INVENTION

Figure 1:
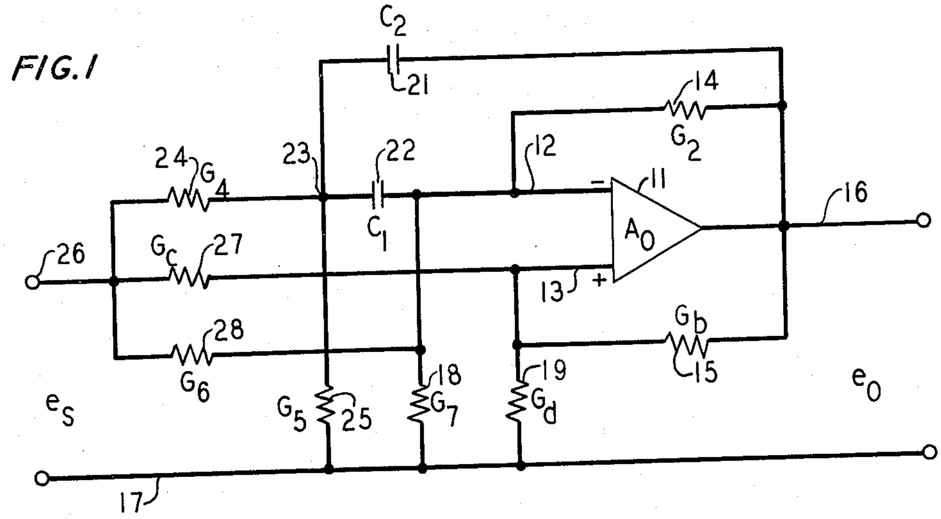
FIG. 1 is a schematic circuit diagram of a general second-order filter section in accordance with this invention.

According to the principles of this invention, the circuit of FIG. 1 comprises an operational amplifier 11, having differential input terminals 12 and 13, exhibiting a gain $A_o$. Two resistors 14 and 15 shunt amplifier 11 and are connected, respectively, between amplifier input terminals 12 and 13 and amplifier output terminal 16, which also serves as the output terminal of the complete circuit of FIG. 1. Connected between a fixed potential common lead 17, e.g., ground, and amplifier input terminals 12 and 13, respectively, are resistors 18 and 19. Capacitors 21 and 22 are serially connected between output terminal 16 and amplifier input terminal 12. Connected to the common terminal junction of capacitors 21 and 22 are resistors 24 and 25, the other terminal of resistor 25 being connected to common lead 17 and the other terminal of resistor 24 being connected to circuit input terminal 26. Resistors 27 and 28 are connected between input terminal 26 and amplifier terminals 13 and 12, respectively. The values of the various resistors, depicted in FIG. 1, are identified in terms of conductance, i.e., the reciprocal of resistance, for example, $G_4$, $G_5$, etc.; the capacitive values of capacitors 22 and 21 are designated as $C_1$ and $C_2$, respectively.

Figure 2:
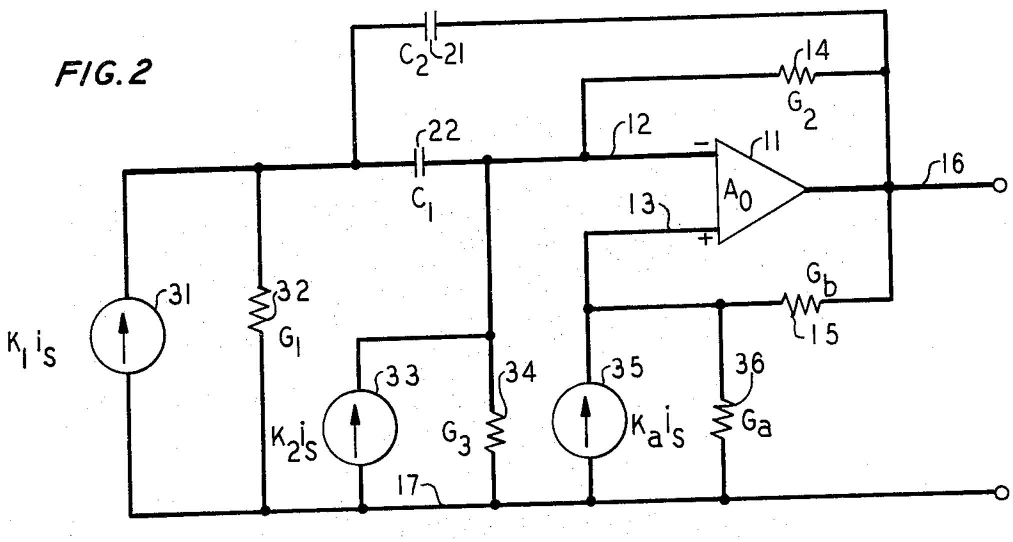
FIG. 2 is a circuit diagram of the electrical equivalent of the circuit of FIG. 1.

For exemplary purposes, an equivalent circuit to that of FIG. 1 using ideal current sources 31, 33, and 35 is shown in FIG. 2.

The relationship between the various parameters of the circuits of FIG. 1 and FIG. 2 are given by the following expression:

$$G_a = G_c + G_d$$
$$G_1 = G_4 + G_5$$
$$G_3 = G_6 + G_7$$
$$K_a = G_c/G_a$$
$$K_1 = G_4/G_1$$
$$K_2 = G_6/G_3. \qquad (1)$$

The transfer function of the circuit of FIG. 1 may be shown to be:

$$\frac{e_o}{e_s}=\frac{\left\{\begin{array}{l}C_1C_2G_aK_aS^2+[G_1G_aK_a(G_2+G_3+G_1)+C_2G_aK_a(G_2+G_3)\\-C_1G_1K_1(G_a+G_b)-(C_1+C_2)G_3K_2(G_a+G_b)]s\\+G_1G_aK_a(G_2+G_3)-G_1G_3K_2(G_a+G_b)\end{array}\right\}}{\left\{\begin{array}{l}[C_1C_2G_a+\frac{C_1C_2(G_a+G_b)}{A_o}]s^2+[(C_1+C_2)(G_aG_2-G_bG_3\\-C_1G_1G_b+\frac{(C_1+C_2)}{A_o}(G_a+G_b)(G_2+G_3)+\frac{C_1}{A_o}G_1(G_a+G_b)]s\\+G_1(G_aG_2-G_bG_3)+\frac{G_1}{A_o}([G_2+G_3)(G_a+G_b)\end{array}\right\}} \quad (2)$$

Assuming the gain $A_o$ of amplifier 11 to be infinite, a common assumption when operational amplifiers are used, the transfer function of Eq. (2) may be expressed as:

$$\frac{e_o}{e_s}=\frac{K_as^2+Es+D}{s^2+As+B}(0 \quad K_a \quad 1) \quad (3)$$

where $$A=\frac{(C_1+C_2)(G_aG_2-G_bG_3)-C_1G_1G_b}{C_1C_2G_a} \quad (4)$$

$$B=\frac{G_1(G_aG_2-G_bG_3)}{C_1C_2G_a} \quad (5)$$

$$D=\frac{G_1G_aK_a(G_2+G_3)-G_1G_3K_2(G_a+G_b)}{C_1C_2G_a} \quad (6)$$

$$E=\frac{\left\{\begin{array}{l}C_1G_aK_a(G_1+G_2+G_3)+C_2G_2K_a(G_2+G_3)\\-C_1G_1K_1(G_a+G_b)-(C_1+C_2)G_3K_2(G_a+G_b)\end{array}\right\}}{C_1C_2G_a} \quad (7)$$

To facilitate the design of a desired filter section, Eqs. (3) through (7) may be solved to develop the following equations:

$$G_1=\frac{C_2G_a}{2G_b}+\left[-A+\left(A^2+4\left(1\quad\frac{C_1}{C_2}\right)B\quad\frac{G_b}{G_a}\right)^{1/2}\right] \quad (7a)$$

$$K_1=\frac{K_a+\left(1+\frac{C_1}{C_2}\right)D\frac{C_2^2}{G_1^2}-E\frac{C_2}{G_1}}{1+\frac{G_b}{G_a}} \quad (7b)$$

$$G_3=\frac{C_1C_2G_aB\left(\frac{D}{B}-K_a\right)}{G_1(G_a+G_b)(K_a-K_2)} \quad (7c)$$

$$G_2=\frac{C_1C_2B}{G_1}+\frac{G_bG_3}{G_a} \quad (7d)$$

The parameters for these equations are the coefficients of the transfer function, i.e., A, B, D, E, and $K_a$, of Eq. (3) and circuit element values $C_1$, $C_2$, $G_a$, and $G_b$, which are arbitrarily selected. Parameter $K_2$ is chosen to be either 0 or 1 in Eq. (*7c*) to provide a minimum positive value for $G_3$, since a large value for parameter $G_3$ degrades the circuits's sensitivity performance. Once having selected the values for $G_1$, $K_1$, $K_2$, $G_3$, and $G_2$, the remaining element values of the circuit of FIG. 1 are determined readily from Eq. (1).

By the practice of this invention, the circuit depicted in FIG. 1, and described by the above equations, may readily be altered to obtain a wide variety of diverse filter transfer functions. For example, the circuit depicted in FIG. 3 exhibits a bandpass filter transfer function given by the following expression:

$$\frac{e_o}{e_s}=\frac{Es}{s^2+As+B}. \quad (8)$$

The instant circuit is substantially the same as that of FIG. 1 but has been simply altered by the deletion of resistors 27, 28, and 18. Of course, where a resistor is deleted, here, and in the following cases, the conductive value of the deleted resistor should be set equal to zero in the relevant equations.

In determining the circuit element values for the desired filter bandpass transfer function, the value of E in EQ. (*7b*) must be inserted as a negative quantity to provide a positive value for $K_1$. Furthermore, since an indeterminate relationship arises in the case of Eq. (*7c*), the values of $G_3$ may be made equal to zero, thereby eliminating a resistor and improving pole sensitivity. Peak gain is attained when $K_1$ is equal to unity.

Figure 4:
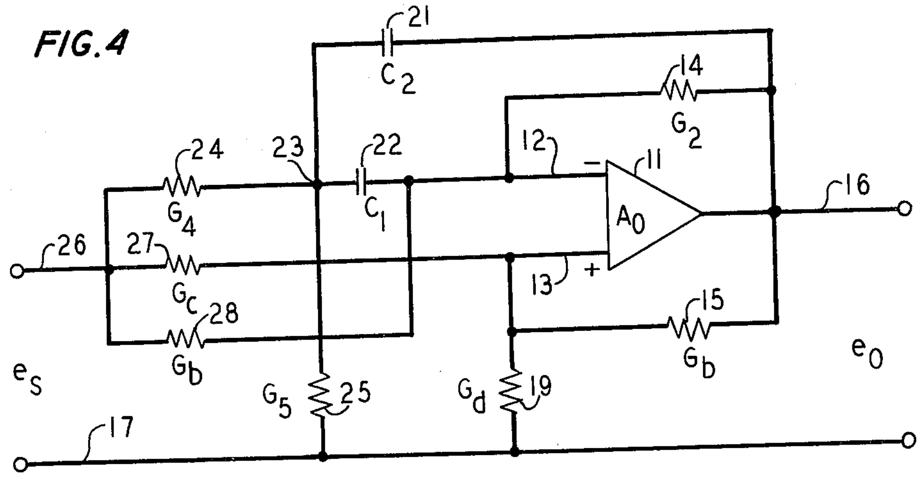
FIG. 4 is a schematic circuit diagram of the circuit of FIG. 1 modified to exhibit a high-pass or a high-pass notch filter transfer function.

The circuit of FIG. 4, differing from that of FIG. 1 only by the absence of resistor 18, exhibits a highpass filter transfer function given by the following expression:

$$\frac{e_o}{e_s}=\frac{K_as^2}{s^2+As+B}. \quad (9)$$

For this case, i.e., high-pass filter transfer function, the solution of Eq. (*7c*) poses a problem since D = 0, and $K_a$ being unequal to zero, the numerator is necessarily negative. Therefore, $K_2$ must be greater than $K_a$ and may appropriately be made equal to unity to provide a suitable value for $G_3$.

Figure 5:
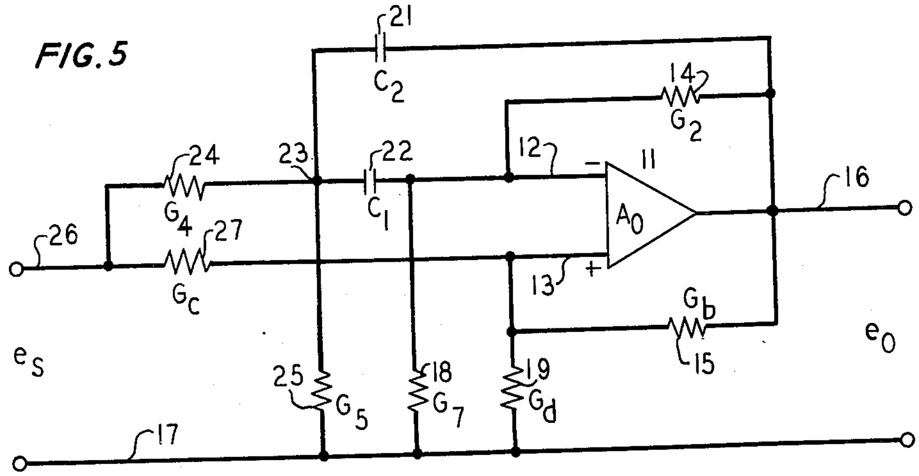
FIG. 5 is a schematic circuit diagram of the circuit of FIG. 1 modified to exhibit a low-pass notch filter transfer function.

In the circuit of FIG. 5, resistor 28 of FIG. 1 has been deleted. The resultant circuit has a low-pass notch filter transfer function defined by Eq. (3) with coefficient E generally made equal to zero. The low-pass notch filter is further characterized as having a D.C. gain which is greater than the gain at infinite frequency. Accordingly, in terms of the parameters of Eq. (3), coefficients $K_a$ should be less than the ratio of coefficient D to coefficient B. Parameter $K_2$ may conveniently be set equal to zero, thereby assuring a positive and minimum value for $G_3$.

Contrarily, a high-pass notch filter is characterized as having a D.C. gain which is less than the gain of the filter at infinite frequency, i.e., coefficient $K_a$ is greater than the ratio of coefficient D to coefficient B. The structure of a circuit exhibiting such a characteristic is identical to that of FIG. 4. For this case, to assure a positive and minimum value for $G_3$, $K_2$ should be set equal to unity.

Figure 6:
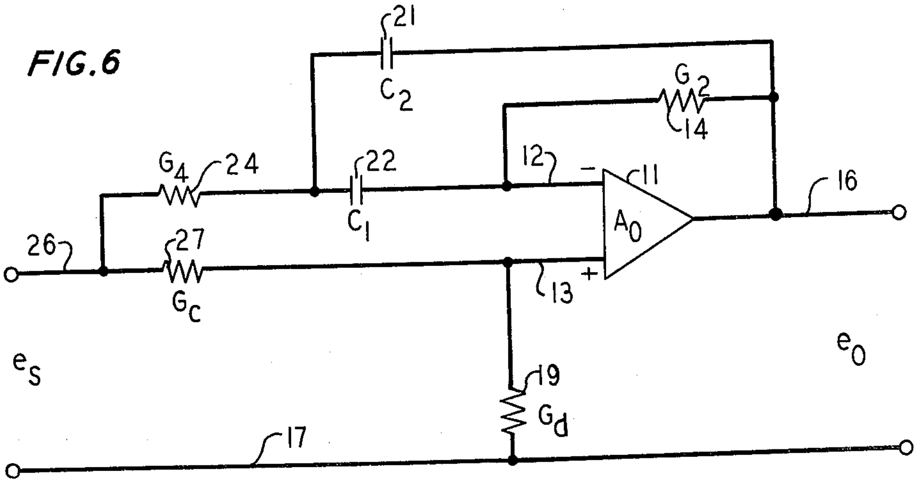
FIG. 6 is a schematic circuit diagram of a 360° all-pass filter section derived from the circuit of FIG. 1.

A 360° all-pass filter section is realized using the circuit of FIG. 6. Comparing this circuit with that of FIG. 1, it is noted that resistors 28, 25, and 18 have been deleted. The proper values for the elements of this circuit are obtained by setting parameters $G_b = G_3 = 0$, $K_1$ equal to 1, and by satisfying the following equations:

$$D = K_a B \qquad (10)$$

$$E = -K_a A \qquad (11)$$

It may be shown that the magnitude of the transfer function of the filter section of FIG. 6 is equal to $K_a$ and is therefore less than 1.

Figure 7:
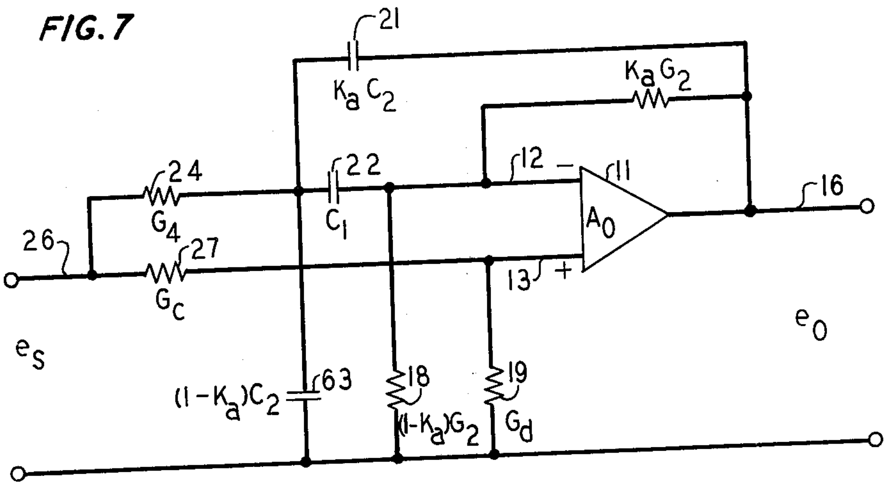
FIG. 7 is a schematic circuit diagram of a 360° all-pass filter section with improved gain performance.

In accordance with this invention, the gain performance of the circuit of FIG. 6 may be improved by modifying the feedback circuits of FIG. 6. As shown in FIG. 7, an additional capacitor 63, having a value $(1-K_a)C_2$ is connected between the junction of resistor 24 and capacitor 22, and line 17, and a resistor 18 is connected between amplifier input terminal 12 and line 17. As indicated, the values of certain circuit elements, i.e., capacitor 21 and resistors 14 and 18, have factors of $K_a$ or $(1 - K_a)$. The transfer function for the circuit of FIG. 7 is given by the following expressions, assuming, for convenience, that the value of capacitor $C_1$ is equal to the value of capacitor of $C_2$ and that both are equal to C:

$$\frac{e_o}{e_s} = \frac{s^2 - \frac{1}{C}\left[G_1\left(\frac{1}{K_a} - 1\right) - 2G_2\right]s + \frac{G_1G_2}{C^2}}{s^2 + \frac{2G_2}{C}s + \frac{G_1G_2}{C^2}} \qquad (12)$$

or $$\frac{e_o}{e_s} = \frac{s^2 - \frac{2G_2}{C}s + \frac{G_1G_2}{C^2}}{s^2 + \frac{2G_2}{C}s + \frac{G_1G_2}{C^2}},\ K_a = (1+A^2/B)^{-1} \qquad (13)$$

$$A = \frac{2G_2}{C},\quad B = \frac{G_1G_2}{C^2}. \qquad (14)$$

The design equations for the 360° all-pass section of FIG. 7 are:

$$G_1 = 2BC/A \qquad (15)$$

$$G_2 = 0.5CA \qquad (16)$$

$$G_d = G_c(1-K_a)/K_a \qquad (17)$$

where the input parameters are A, B, C, and $G_c$.

Figure 8:
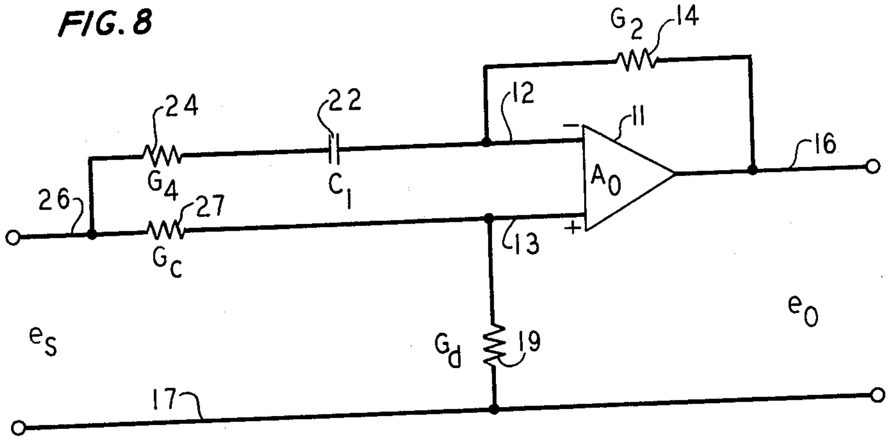
FIG. 8 is a schematic circuit diagram of a 180° all-pass filter section derived from the circuit of FIG. 1.
Figure 9:
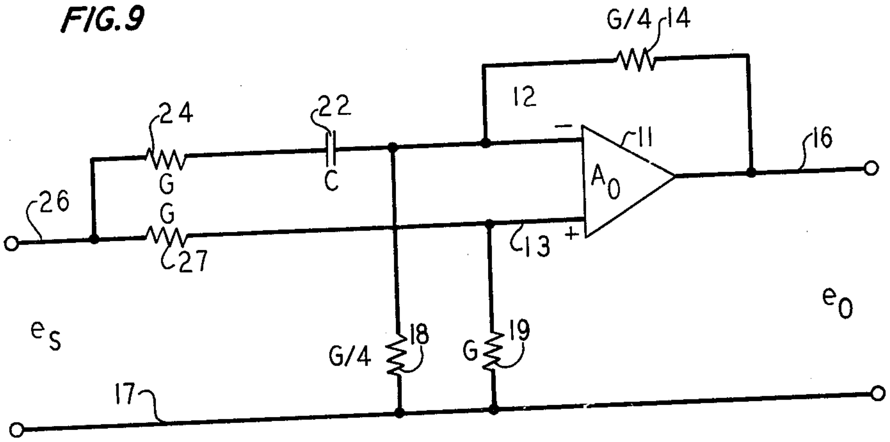
FIG. 9 is a schematic circuit diagram of a 180° all-pass filter section with improved gain performance.

Similarly, a 180° all-pass section may be developed by deleting capacitor 21 of FIG. 6 as shown in FIG. 8. Since the gain of this circuit is also less than unity, its gain performance may be improved by modification of the circuit of FIG. 8. As shown in FIG. 9, resistor 18 has been connected between amplifier input terminal 12 and lead 17. The values of the elements are as indicated, and the transfer function for this filter section is given by the following expression:

$$\frac{e_o}{e_s} = \frac{-s + G/C}{s + G/C}. \qquad (18)$$

Figure 3:
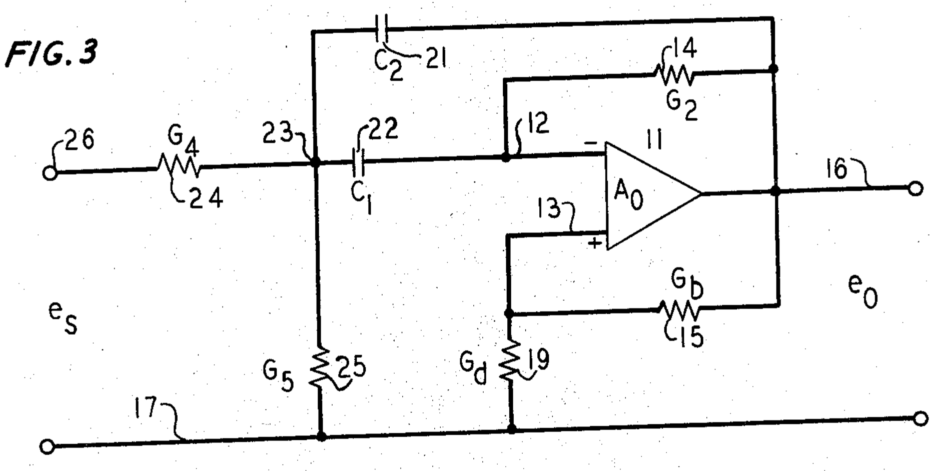
FIG. 3 is a schematic circuit diagram of a modified version of the filter of FIG. 1 which exhibits a bandpass transfer function.

An exemplary bandpass filter, constructed in accordance with one embodiment of this invention as illustrated by FIG. 3, having a Q of 80 at a frequency of 1 KHz and with a peak gain of 10 performed satisfactorily by using circuit elements having the values listed in Table I.

Table I $C_1 = 0.005\ \mu f$ $C_2 = 0.05\ \mu f$ $1/G_2 = 254.6K$ ohms $1/G_4 = 25.86K$ ohms $1/G_5 = 404.1$ ohms b $1/G_b = 12.8K$ ohms 1/200. d = 100. ohms

What is claimed is:

1. An RC filter circuit (FIG. 1) which utilizes a single amplifier to provide an output signal, between an output terminal and a reference terminal having fixed potential, which is a second order transformation of an input signal applied between an input terminal and said reference terminal, said filter circuit comprising:

- a single amplifier having first and second input terminals and having a single output terminal, said single output terminal common with said filter output terminal;
- a first resistor connected to said amplifier first input terminal and to said filter output terminal;
- a second resistor connected to said amplifier second input terminal and to said filter output terminal;
- a circuit branch comprising the serial connection of a third resistor and a first capacitor, the resistor terminal of said circuit branch connected to said filter input terminal and the capacitor terminal of said circuit branch connected to said amplifier first input terminal;
- a second capacitor connected to said circuit branch, intermediate said third resistor and said first capacitor, and to said filter output terminal;
- a fourth resistor connected to said filter input terminal and to said amplifier first input terminal;
- a fifth resistor connected to said filter input terminal and to said amplifier second input terminal;
- a sixth resistor connected to said amplifier first input terminal and to said reference terminal;
- a seventh resistor connected to said amplifier second input terminal and to said reference terminal;
- and an eighth resistor connected to said circuit branch, intermediate said third resistor and said first capacitor, and to said reference terminal.

2. An RC filter circuit (FIG. 4) which utilizes a single amplifier to provide an output signal, between an output terminal and a reference terminal having fixed potential, which is a second order transformation of an input signal applied between an input terminal and said reference terminal, said filter circuit comprising:

- a single amplifier having first and second input terminals and having a single output terminal, said single output terminal common with said filter output terminal;
- a first resistor connected to said amplifier first input terminal and to said filter output terminal;

a second resistor connected to said amplifier second input terminal and to said filter output terminal;

a circuit branch comprising the serial connection of a third resistor and a first capacitor, the resistor terminal of said circuit branch connected to said filter input terminal and the capacitor terminal of said circuit branch connected to said amplifier first input terminal;

a second capacitor connected to said circuit branch, intermediate said third resistor and said first capacitor, and to said filter output terminal;

a fourth resistor connected to said filter input terminal and to said amplifier first input terminal;

a fifth resistor connected to said filter input terminal and to said amplifier second input terminal;

a sixth resistor connected to said amplifier second input terminal and to said reference terminal;

and a seventh resistor connected to said circuit branch, intermediate said third resistor and said first capacitor, and to said reference terminal.

3. An RC filter circuit (FIG. 5) which utilizes a single amplifier to provide an output signal, between an output terminal and a reference terminal having fixed potential, which is a second order transformation of an input signal applied between an input terminal and said reference terminal, said filter circuit comprising:

a single amplifier having first and second input terminals and having a single output terminal, said single output terminal common with said filter output terminal;

a first resistor connected to said amplifier first input terminal and to said filter output terminal;

a second resistor connected to said amplifier second input terminal and to said filter output terminal;

a circuit branch comprising the serial connection of a third resistor and a first capacitor, the resistor terminal of said circuit branch connected to said filter input terminal and the capacitor terminal of said circuit branch connected to said amplifier first input terminal;

a second capacitor connected to said circuit branch, intermediate said third resistor and said first capacitor, and to said filter output terminal;

a fourth resistor connected to said filter input terminal and to said amplifier second input terminal;

a fifth resistor connected to said amplifier first input terminal and to said reference terminal;

a sixth resistor connected to said amplifier second input terminal and to said reference terminal;

and a seventh resistor connected to said circuit branch, intermediate said third resistor and said first capacitor, and to said reference terminal.

4. An RC filter circuit (FIG. 7) which utilizes a single amplifier to provide an output signal, between an output terminal and a reference terminal having fixed potential, which is a second order transformation of an input signal applied between an input terminal and said reference terminal, said filter circuit comprising:

a single amplifier having a first and second input terminals and having a single output terminal, said single output terminal common with said filter output terminal;

a first resistor connected to said amplifier first input terminal and to said filter output terminal;

a circuit branch comprising the serial connection of a second resistor and a first capacitor, the resistor terminal of said circuit branch connected to said filter input terminal and the capacitor terminal of said circuit branch connected to said amplifier first input terminal;

a second capacitor connected to said circuit branch, intermediate said second resistor and said first capacitor, and to said filter output terminal;

a third resistor connected to said filter input terminal and to said amplifier second input terminal;

a fourth resistor connected to said amplifier first input terminal and to said reference terminal;

a fifth resistor connected to said amplifier second input terminal and to said reference terminal;

and a third capacitor connected to said circuit branch, intermediate said second resistor and said first capacitor, and to said reference terminal.

5. An RC filter circuit (FIG. 9) which utilizes a single amplifier to provide an output signal, between an output terminal and a reference terminal having fixed potential, which is a second order transformation of an input signal applied between an input terminal and said reference terminal, said filter circuit comprising:

a single amplifier having first and second input terminals and having a single output terminal, said single output terminal common with said filter output terminal;

a first resistor connected to said amplifier first input terminal and to said filter output terminal;

a circuit branch comprising the serial connection of a second resistor and a first capacitor, the resistor terminal of said circuit branch connected to said filter input terminal and the capacitor terminal of said circuit branch connected to said amplifier first input terminal;

a third resistor connected to said filter input terminal and to said amplifier second input terminal;

a fourth resistor connected to said amplifier first input terminal and to said reference terminal;

and a fifth resistor connected to said amplifier second input terminal and to said reference terminal.

6. In an RC filter circuit (FIG. 8) having an input port including an input terminal and a reference terminal of fixed potential and an output port including an output terminal and said reference terminal, a single amplifier having a first and second input terminals and a single output terminal, said single output terminal common with said filter output terminal, a first circuit branch including a first resistor and a first capacitor serially connected, the resistor terminal of said first circuit branch connected to said filter input terminal and the capacitor terminal of said first circuit branch connected to said amplifier first input terminal, a second resistor connected to said filter input terminal and to said amplifier second input terminal, a third resistor connected to said amplifier second input terminal and to said reference terminal of fixed potential, the improvement comprising:

a single feedback path connected to said amplifier output terminal consisting solely of a resistive device connected between said amplifier output terminal and said first input terminal of said single amplifier.

7. A filter circuit (FIG. 1) as defined in claim 5 further comprising:

a sixth resistor connected to said amplifier second input terminal and to said filter output terminal;

a second capacitor connected to said second resistor and said first capacitor and to said filter output terminal;

a seventh resistor connected to said filter input terminal and to said amplifier first input terminal;

and an eighth resistor connected to said second resistor and said first capacitor and to said terminal of fixed potential.

8. A filter circuit (FIG. 5) as defined in claim 5 further comprising:

a sixth resistor connected to said amplifier second input terminal and to said filter output terminal;

a second capacitor connected to said second resistor and said first capacitor and to said filter output terminal;

and a seventh resistor connected to said second resistor and said first capacitor and to said terminal of fixed potential.

9. A filter circuit (FIG. 7) as defined by claim 5 further comprising:

a second capacitor connected to said second resistor and said first capacitor and to said filter output terminal;

and a third capacitor connected to said second resistor and to said first capacitor and to said terminal of fixed potential.

10. A filter circuit (FIG. 9) as defined by claim 6 further comprising:

a fourth resistor connected to said amplifier first input terminal and to said terminal of fixed potential.

* * * * *

UNITED STATES PATENT AND TRADEMARK OFFICE

CERTIFICATE OF CORRECTION

PATENT NO. : 3,919,658

DATED : November 11, 1975

INVENTOR(S) : Joseph J. Friend

It is certified that error appears in the above-identified patent and that said Letters Patent are hereby corrected as shown below:

Column 3, Eq. (2), line 1, after the bracket, "$G_1$" should be --$C_1$--; line 7, "$G_b$)" should be --($G_2$--; line 9, after "$\frac{G_1}{A_o}$" delete the vertical "|" before "$G_2$"; Eq. (3), after "O" change "$<$" to --$\leq$--; after "$K_a$" change "$<$" to --$\leq$--; Eq. (7a) delete "+" sign before the large open bracket; same equation, "$1\frac{c_1}{c_2}$" should read -- $1+\frac{c_1}{c_2}$ --.

Column 6, Table 1, cancel the "b" before "$1/G_b$"; last line of Table 1, "1/200.d=100. ohms" should read --$1/G_d$=200. ohms--.

Column 8, line 44, delete "a".

Signed and Sealed this

*thirteenth* Day of *April 1976*

[SEAL]

*Attest:*

RUTH C. MASON
*Attesting Officer*

C. MARSHALL DANN
*Commissioner of Patents and Trademarks*